(12) United States Patent
Johnson

(10) Patent No.: US 6,188,519 B1
(45) Date of Patent: Feb. 13, 2001

(54) BIGRATING LIGHT VALVE

(76) Inventor: Kenneth Carlisle Johnson, 2502 Robertson Rd., Santa Clara, CA (US) 95051

( * ) Notice: Under 35 U.S.C. 154(b), the term of this patent shall be extended for 0 days.

(21) Appl. No.: 09/477,024

(22) Filed: Jan. 3, 2000

Related U.S. Application Data

(63) Continuation of application No. 09/286,888, filed on Apr. 9, 1999.
(60) Provisional application No. 60/114,782, filed on Jan. 5, 1999.

(51) Int. Cl.[7] .............................. G02B 5/18; G02B 26/00
(52) U.S. Cl. ...................... 359/572; 359/290; 359/291
(58) Field of Search .................................. 359/572, 290, 359/291, 224, 226; 345/108

(56) References Cited

U.S. PATENT DOCUMENTS

| | | | |
|---|---|---|---|
| 4,751,509 | * 6/1988 | Kubota et al. | 359/572 |
| 5,661,592 | 8/1997 | Bornstein et al. | 359/291 |
| 5,841,579 | 11/1998 | Bloom et al. | 359/572 |

OTHER PUBLICATIONS

Choksi et al., "Maskless extreme ultraviolet lithography," *J. Vac. Sci. Technol.* B 17(6), Nov./Dec. 1999, pp. 3047–3051.
Folta, J.A. et al., "High density arrays of micromirrors," Feb. 1999, pp. 1–9 (UCRL–ID–133164/National Technical Information Service, US Dept. of Commerce, Springfield, VA 22161).

* cited by examiner

*Primary Examiner*—Hung Xuan Dang
(74) *Attorney, Agent, or Firm*—Townsend and Townsend and Crew LLP

(57) ABSTRACT

A spatial light modulator pixel comprises a movable reflective surface in which an array of subapertures is formed, wherein each subaperture contains a fixed (non-movable) island reflector. The movable reflector is micromechanically actuated so that the combination of movable and fixed reflectors functions alternately as a plane mirror or as a two-dimensional diffraction grating (i.e., a "bigrating"), depending on the movable reflector's position. The device is useful for applications such as maskless lithography and high-resolution printing.

5 Claims, 5 Drawing Sheets

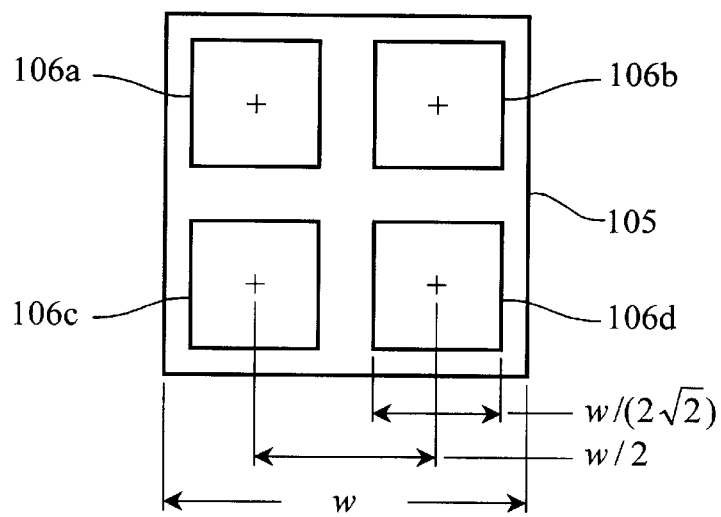
Fig 5
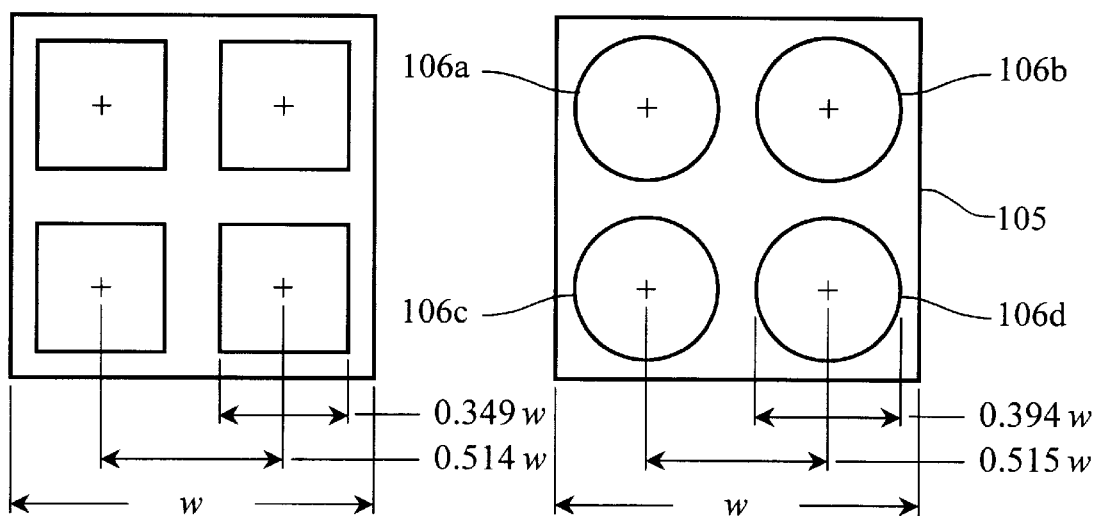
Fig 6          Fig 7

ND LIGHT VALVE

BIGRATING LIGHT VALVE

CROSS-REFERENCES TO RELATED APPLICATIONS

This application claims priority from provisional application 60/114,782 (filed Jan. 5, 1999) and pending application Ser. No. 09/286,888 (filed Apr. 9, 1999), the disclosures of which are incorporated by reference.

BACKGROUND OF THE INVENTION

This invention relates to spatial light modulators that are based on micromechanically-actuated, diffractive mirror structures. A prior-art device in this category, the "Flat Diffraction Grating Light Valve" (U.S. Pat. No. 5,841,579), comprises two interdigitated groups of parallel ribbon reflectors, wherein one group is fixed and the other is electrostatically actuated to control the ribbons' surface heights. The device is dynamically controlled to function alternately as a plane mirror (with the ribbons' reflective surfaces all coplanar) or as a diffraction grating (with the movable ribbon surfaces recessed relative to the fixed ribbons). The device functions as a pixel element in a spatial light modulator that has applications to image displays and printing systems.

Advantages of the grating light valve are that it can operate under high illumination levels and at very high (e.g., megahertz-level) switching rates, and it can be used with broadband illumination. It is especially well adapted for display applications, although it could have potential limitations for applications such as high-resolution printing and maskless lithography that require smaller pixels and more precise control of the image illumination levels. The lithographically defined gaps between ribbons can limit efficiency and contrast, and performance could also be compromised by non-planarity of the elongated ribbon elements.

SUMMARY OF THE INVENTION

This invention is an improved light-modulating pixel device termed a "bigrating light valve" (BLV) comprising a movable reflective surface in which an array of subapertures is formed, wherein a fixed reflective surface fills each subaperture. Illuminating radiation reflects off of the pixel, and the movable surface is electrostatically actuated to control the phase distribution of the reflected radiation across the pixel. Like the grating light valve, the device functions essentially as a plane mirror if the fixed and movable surfaces are coplanar, and it functions as a diffracting element when the movable surface is positionally displaced from the fixed element. But unlike the grating light valve, each pixel comprises a single movable element, and the fixed reflectors in each pixel form a two-dimensional grating (i.e., "bigrating"), rather than a linear grating. The movable element is inherently resistant to torsional bending or distortion that would affect planarity.

The BLV is preferably manufactured by a method in which the gaps between movable and fixed reflectors are defined by a sacrificial film; hence the gap size and dimensional accuracy are not limited by lithographic patterning capabilities. This method would make it possible to make very small pixels that would be useful for applications such as high-resolution printing and maskless lithography. Also, the manufacturing process provides accurate control of the reflective surfaces' planarity and positional relationships, thereby minimizing phase errors in the reflected radiation.

BRIEF DESCRIPTION OF THE DRAWINGS

FIG. 5 illustrates a pixel geometry based on the BLV design method.

FIG. 6 illustrates a pixel geometry that is optimized for maximum contrast.

FIG. 7 illustrates an alternative pixel configuration comprising circular subapertures.

DESCRIPTION OF THE SPECIFIC EMBODIMENTS

Figure 1:
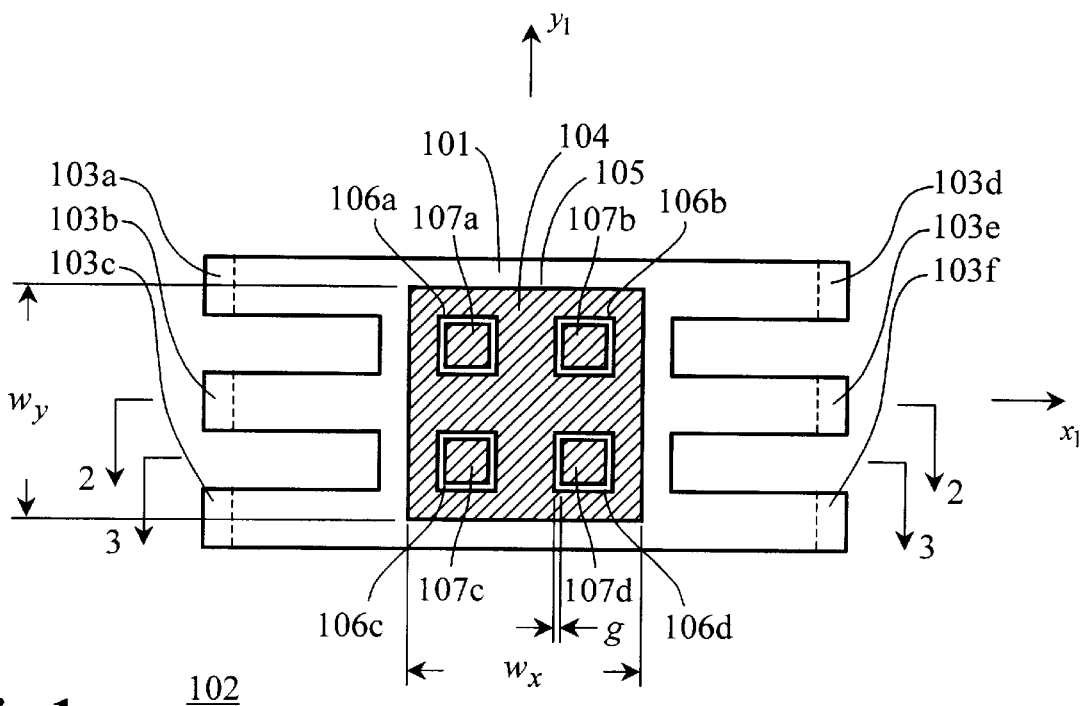
FIG. 1 is a plan view of a BLV pixel element.
Figure 2:
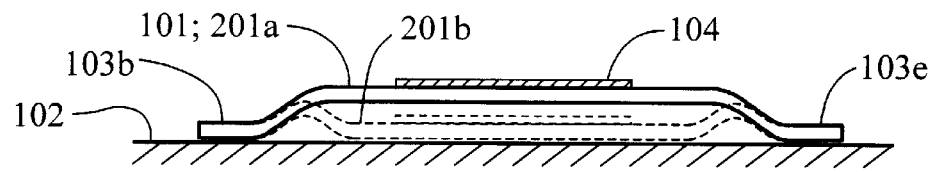
FIG. 2 is a center cross-sectional view of a BLV pixel element.
Figure 3:
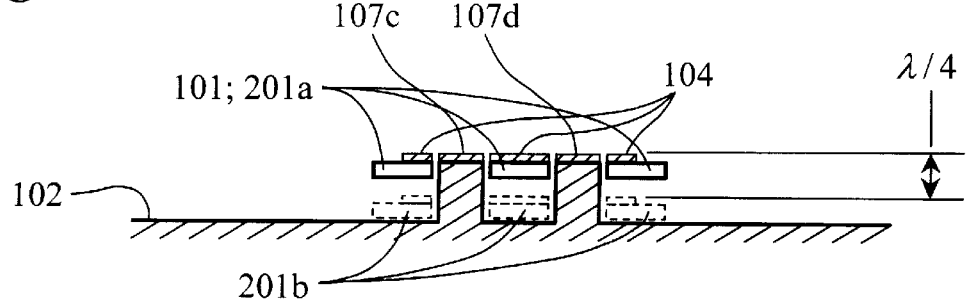
FIG. 3 is a cross-sectional view of a BLV pixel element through two island reflectors.

FIG. 1 shows a plan view of a BLV pixel element, in a preferred embodiment of the invention, and FIGS. 2 and 3 illustrate two cross-sectional views. The pixel comprises a single movable flexure element 101 suspended over a substrate 102 and attached to the substrate at anchor points 103a, 103b, 103c, 103d, 103e, and 103f. The flexure is either conductive or has a conductive film deposited on it, and it is actuated by means of electrostatic interaction with the substrate or with a conductor pad deposited on the substrate (not shown). The actuator mechanism controls the flexure's position relative to the substrate. For example, FIGS. 2 and 3 illustrate the flexure in two alternate positions 201a and 201b. A portion 104 of the flexure is reflective, or coated with a reflective film, and the outer boundary of this portion defines the pixel's clear aperture 105. A matrix pattern of open subapertures 106a, 106b, 106c, and 106d (a 2-by-2 array, in the preferred embodiment) is formed in the reflective region, and stationary island reflectors 107a, 107b, 107d, and 107d are formed within the subapertures. These reflectors are attached directly to the substrate. (Any two-dimensional pattern of subapertures and island reflectors may be used, although a simple 2-by-2 pattern is preferred.)

FIG. 3 shows a cross-sectional view through two of the subapertures 106c and 106d and corresponding island reflectors 107c and 107d. The pixel is in its ON state when the fixed reflectors 107a–d and movable reflector 104 are coplanar (position 201a) and is in its OFF state when reflector 104 is displaced by a quarter wavelength ($\lambda/4$) below reflectors 107a–d (position 201b), wherein $\lambda$ is a design operating wavelength. (The design is optimized for operation at a particular wavelength, although it may exhibit acceptable performance over and extended wavelength range.) The above-described ON and OFF positions may alternatively be shifted by any integer multiple of $\lambda/2$. (For example, reflector 104 could alternatively be electrostatically repulsed in the OFF state, rather than attracted, to deflect it away from the substrate by $\lambda/4$.) The movable mirror may also be positioned at intermediate locations to provide continuous, gray-level modulation control.

Figure 4:
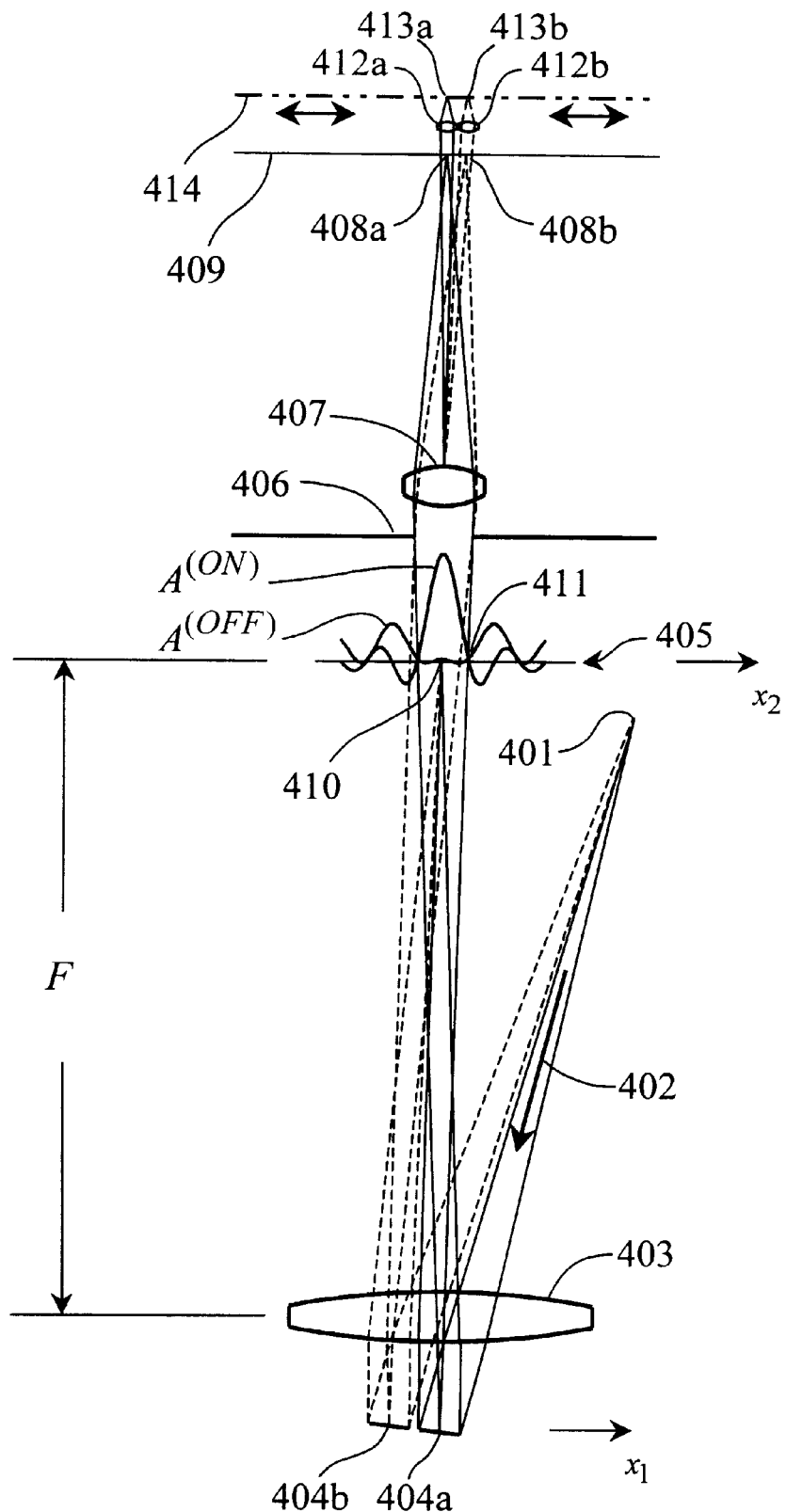
FIG. 4 schematically illustrates the BLV's principle of operation.

FIG. 4 schematically illustrates the BLV's principle of operation. A point light source 401 produces illumination 402, which is collimated by a collimator lens 403 and illuminates a BLV pixel 404a. The illumination is reflected by the pixel, passes back through lens 403 and is focused onto a focal plane 405. (The focal plane is conjugate to source point 401.) A projection aperture 406 proximate to the focal plane filters the focused beam, and an imaging lens 407 images pixel 404a onto a conjugate point 408a on an image plane 409. (A printing or display surface may be disposed in plane 409.)

When the pixel is in its ON (non-diffracting) state, the illumination radiation on plane 405 has a diffraction-limited amplitude distribution, illustrated as $A^{(ON)}$ in FIG. 4, which has a peak centered at the position of the source's geometric image 410. In its OFF (diffracting) state the pixel diverts radiation away from the geometric image point, and the diffracted amplitude has the form illustrated as $A^{(OFF)}$. Thus, when the pixel is ON a substantial portion of the reflected radiation will be filtered through aperture 406 and will illuminate image point 408a, whereas in its OFF state the pixel diverts radiation out of the aperture and the image point will be dark. Similarly, adjacent pixel 404b modulates the image intensity at point 408b, and a spatial light modulator comprising a full array of such pixels creates a digitally synthesized, dynamically modulated image across image plane 409.

FIG. 4 represents just one of a variety of optical configurations that could be used with the BLV. For example, the above-noted patent application Ser. No. 09/286,888, "High-Throughput, Maskless Lithography System" discloses a high-resolution printing system in which off-axis portions of a parabolic mirror perform the functions of lenses 403 and 407 in FIG. 4. The spatial light modulator in the disclosed embodiment is a grating light valve, but a BLV would function equally well.

A printing surface could be disposed in or near the image plane 409, but the printing resolution would be limited by the numerical aperture of lens 407. The '888 invention circumvents this limitation by using a microlens array proximate to image plane 409 to condense the radiation from each pixel 404a, 404b, etc., onto a corresponding highly resolved focal point on a printing surface. For example, FIG. 4 illustrates a microlens 412a that condenses radiation from pixel 404a onto a focal point 413a on a printing surface 414, and an adjacent microlens 412b similarly condenses radiation from pixel 404b onto point 413b. The surface is raster-scanned as the focal point intensities are modulated so that a very high-resolution exposure image is formed on the printing surface.

A BLV pixel has the effect of applying an amplitude scale factor $A_1[x_1, y_1]$ to the incident radiation's amplitude distribution, wherein $x_1$ and $y_1$ are position coordinates on the pixel (FIG. 1) and $$A_1[x_1, y_1] = r[x_1, y_1]\exp[-i4\pi h[x_1, y_1]/\lambda] \qquad \text{Eq 1}$$

wherein $r[x_1, y_1]$ is the mirror reflectance amplitude distribution across the pixel aperture, and $h[x_1, y_1]$ is the mirror height distribution relative to the fixed reflectors' surface height. Assuming a unit-amplitude incident beam, $A_1[x_1, y_1]$ represents the reflected beam's amplitude distribution across the pixel aperture. (Actually, if the beam is obliquely incident as illustrated in FIG. 4 it will have a phase gradient across the pixel aperture, but Eq 1 will still represent the reflected beam amplitude across a plane parallel to the reflected wavefronts.) The reflected radiation has a corresponding amplitude distribution $A_2[x_2, Y_2]$ on source focal plane 405 (FIG. 4). For any specific wavelength $\lambda$, the $A_2$ distribution has a Fourier transform relationship to the $A_1$ distribution, $$A_2[x_2, y_2] = \frac{1}{\lambda F}\int\int A_1[x_1, x_2]\exp\left[i2\pi\frac{x_1x_2 + y_1y_2}{\lambda F}\right]dx_1dy_1 \qquad \text{Eq 2}$$

wherein $x_2$ and $Y_2$ are position coordinates on plane 405 and F is the focal length of lens 403 (or of an equivalent substituted focusing element, such as the parabolic mirror in the '888 application). (Eq 2 is equivalent to Eq 4 in the '888 application.) The $A^{(ON)}$ amplitude profile in FIG. 4 corresponds to the $A_2$ distribution for the case when $h[x_1, Y_1]$ is identically zero across the entire pixel aperture. (More generally, the ON-state height distribution $h[x_1, Y_1]$ need only be an integer multiple of $\lambda/2$ at any position on the pixel.) The $A^{(OFF)}$ amplitude profile corresponds to the $A_2$ distribution when $h[x_1, Y_1]$ is equal to $\pm\lambda/4$ over the movable reflector (or more generally, when $h[x_1, Y_1]$ modulo $\lambda/2$ is equal to $\lambda/4$).

Eq 2 can be used to estimate the image point intensity in the pixel's ON and OFF states, or at intermediate states wherein the movable reflector position is between its ON and OFF positions. (The image point intensity is proportional to the integral of $|A_2[x_2, Y_2]|^2$ over the portion of focal plane 405 area that is delimited by projection aperture 406.) Design parameters such as the shapes and dimensions of the pixel reflectors and aperture 406 can be selected to maximize the contrast ratio, defined as the ratio of the ON- to OFF-state image intensity.

A good starting point for the design can be obtained as follows: First, the pixel dimensions are selected so that the reflective area of the movable reflector (excluding the subapertures) is equal to the combined reflective area of the fixed island reflectors. Under this condition the $A^{(OFF)}$ amplitude profile (FIG. 4) will be zero at its center point 410. Second, the pixel geometry is selected so that the reflectance amplitude distribution $r[x_1, y_1]$ and height distribution $h[x_1, y_1]$ are even functions of $x_1$ and $y_1$, i.e., $$r[x_1, y_1] = r[-x_1, y_1] = r[x_1, -y_1] \qquad \text{Eq 3}$$

$$h[x_1, y_1] = h[-x_1, y_1] = h[x_1, -y_1] \qquad \text{Eq 4}$$

Consequently, the $A^{(OFF)}$ profile will have zero slope at the center point. Third, the pixel's reflective area is confined to a rectangular region with dimensions $w_x$ and $w_y$ in the respective x and y directions (FIG. 1), and the pixel geometry is selected so that within this rectangle the functions $r[x_1, y_1]$ and $h[x_1, y_1]$ are periodic modulo $w_x/2$ in the x direction and modulo $w_y/2$ in the y direction, i.e., $$r[x_1+w_x/2, y_1]=r[x_1, y_1] \text{ for } -w_x/2 < x_1 < 0 \qquad \text{Eq 5}$$

$$h[x_1+w_x/2, y_1]=h[x_1, y_1] \text{ for } -w_x/2 < x_1 < 0 \qquad \text{Eq 6}$$

$$r[x_1, y_1+w_y/2]=r[x_1, y_1] \text{ for } -w_y/2 < y_1 < 0 \qquad \text{Eq 7}$$

$$h[x_1, y_1+w_y/2]=h[x_1, y_1] \text{ for } -w_y/2 < y_1 < 0 \qquad \text{Eq 8}$$

As a consequence of these conditions, the $A^{(OFF)}$ profile will have zero crossings coinciding with the $A^{(ON)}$ amplitude profile's first diffraction nodes such as node 411 (FIG. 4).

FIG. 5 illustrates a pixel geometry based on the above design approach. The pixel aperture 105 and subapertures 106a–d in the FIG. 5 design are all square ($w_x=w_y=w$). If the projection aperture 406 in FIG. 4 is square, with the aperture edge positions coinciding with the $A^{(ON)}$ amplitude profile's first diffraction nodes (such as node 411), then the theoretical contrast ratio for this design is 214. FIG. 6 illustrates a similar pixel configuration that is optimized for maximum contrast. This design exhibits a theoretical contrast ratio of 1560. The aperture shapes need not be square or rectangular. For example, FIG. 7 illustrates an alternative pixel configuration comprising circular subapertures 106a–d. This design has a theoretical contrast ratio of 1434. (The gap g between the movable and fixed reflectors in FIG. 1 is neglected in these contrast calculations. A large gap would result in significant contrast reduction.)

Figure 8A:
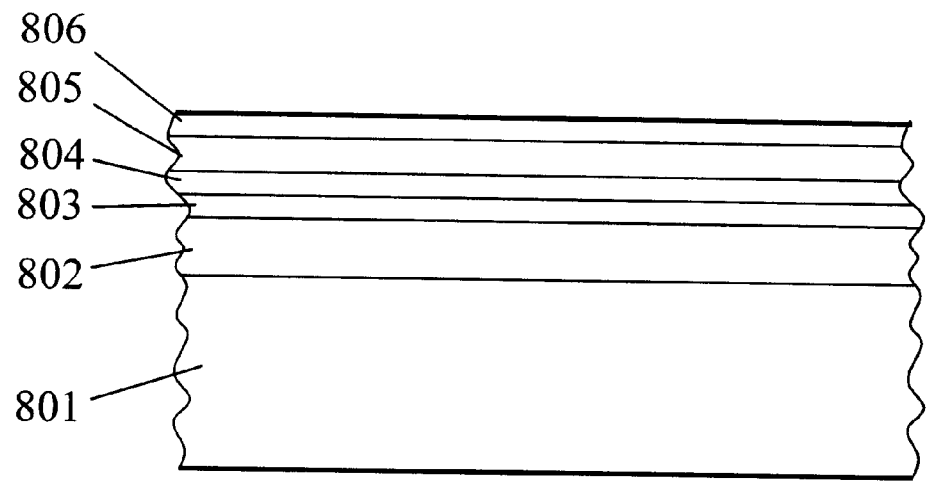
FIGS. 8A–D illustrate a BLV manufacturing process.
Figure 8B:
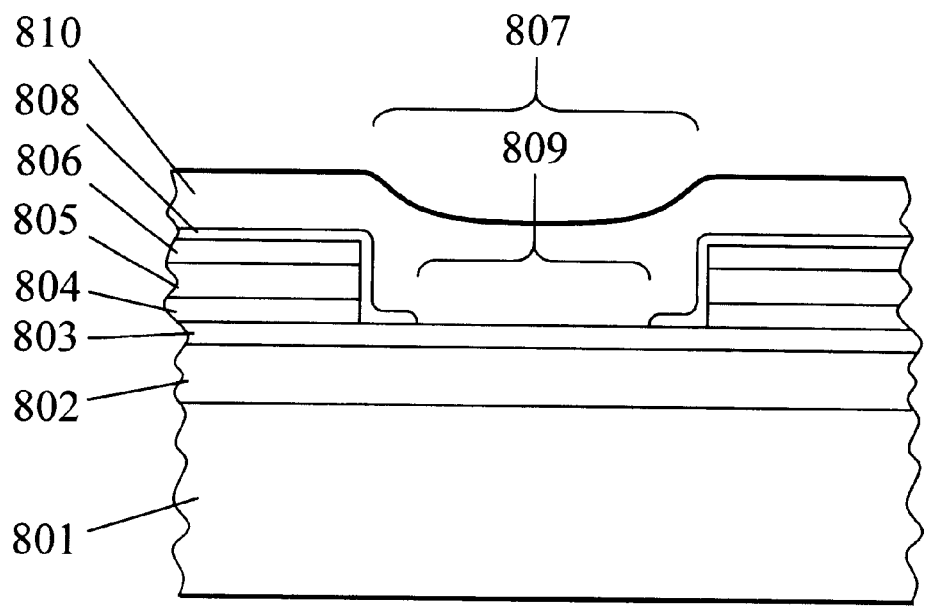
Figure 8C:
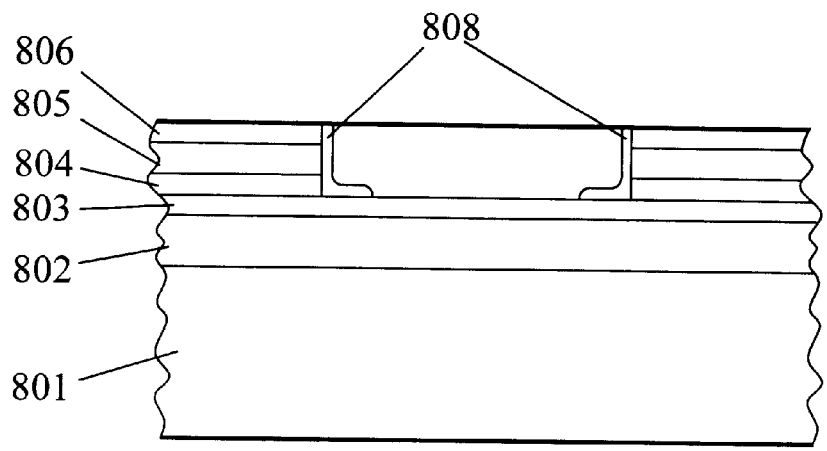
Figure 8D:
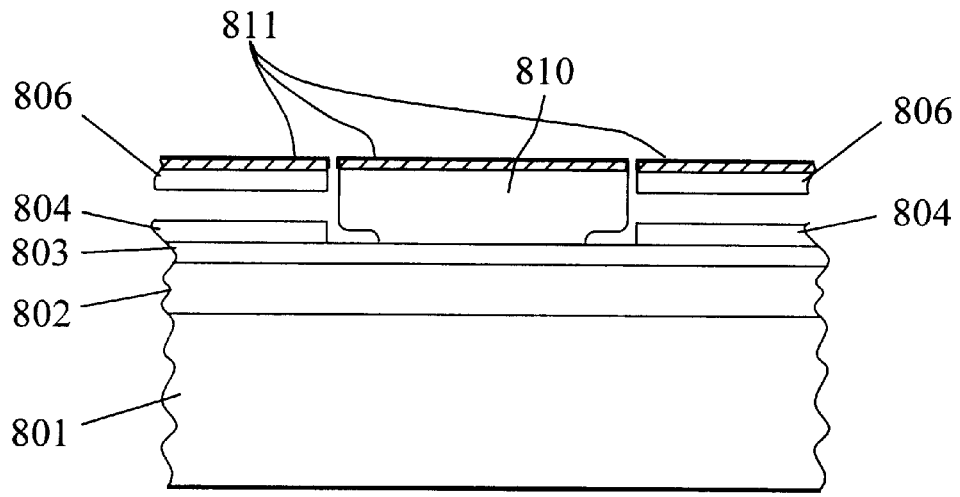

Manufacturing processes that are used to manufacture the grating light valve (U.S. Pat. No. 5,661,592) or other micromechanical systems would also be applicable to BLV fabrication. The main difference between the BLV and grating light valve processes would be the formation of the island reflectors. One possible fabrication approach is illustrated in FIGS. 8A–D. (These figures only show a portion of the device cross-section through one of the island reflectors.) First, a multilayer structure is formed as shown in FIG. 8A. The structure comprises a silicon substrate 801, a field oxide 802, nitride 803, tungsten 804, a PSG sacrificial layer 805, and nitride 806. Next (FIG. 8B), the subaperture regions (e.g. region 807) are lithographically patterned and etched down to the first nitride layer 803; a second thin sacrificial layer 808 is deposited and etched through over each island reflector's central region (e.g. region 809); and a third nitride layer 810 is deposited. Then (FIG. 8C) the structure is planarized to remove material above the second nitride layer 806. Finally (FIG. 8D) the sacrificial layers 805 and 808 are removed and the structure is overcoated with a reflective aluminum layer 811. The second nitride layer 806 becomes the flexure element (101 in FIGS. 1–3), which is attached to the substrate at its ends. (The process for attaching it is omitted in the above process description, but a suitable process is described in the '592 patent.) The third nitride layer 810 forms a base for the stationary island reflectors (107*a–d* in FIG. 1).

An advantage of the above type of fabrication process is that the gap g between the flexure element 101 and the island reflectors 107*a–d* in FIG. 1 is determined by the thickness of the second sacrificial layer 808, which can be smaller than the lithographic resolution limit. Thus, this method or similar methods could be beneficial for fabricating very small pixel geometries. A reduced pixel scale could have a number of advantages, including cost, speed, and power consumption. Surface flatness tolerances can be more easily maintained over small pixels. And for applications such as high-resolution printing or maskless lithography at deep ultraviolet or extreme ultraviolet wavelengths, smaller pixels would simplify the system by allowing the imaging system to operate closer to unit magnification and to use smaller, less expensive optical elements.

What is claimed is:

1. A spatial light modulator comprising an array of radiation-modulating pixel elements, wherein each pixel comprises a movable, micromechanically-actuated, reflective surface, an array of subapertures is formed in each movable surface, an array of fixed island reflectors fills respective subapertures of each movable surface, illuminating radiation reflects off of the pixel array, and each pixel's movable surface is actuated to control the reflected radiation's phase distribution across the pixel.

2. The spatial light modulator of claim 1, wherein the radiation originates from a radiation source, the reflected radiation is focused onto a focal plane conjugate to the source, a portion of the reflected radiation is filtered by a projection aperture proximate to the focal plane, and the phase distribution across each pixel determines the amount of reflected radiation energy from that pixel that is filtered by the projection aperture.

3. The spatial light modulator of claim 2, wherein the filtered radiation from each pixel is focused onto a corresponding image point on an image plane conjugate to the pixel array, and each pixel controls the image intensity at a corresponding image point on the image plane.

4. The spatial light modulator of claim 3, wherein a printing surface is disposed proximate to the image plane and is exposed by the filtered radiation.

5. The spatial light modulator of claim 3, wherein a microlens array is disposed proximate to the image plane, the filtered radiation from each pixel is focused by a corresponding microlens element onto a focal point proximate to a printing surface, and the printing surface is scanned relative to the focal points as the pixels are actuated to form a digitally-synthesized, high-resolution exposure image on the printing surface.

* * * * *

UNITED STATES PATENT AND TRADEMARK OFFICE
CERTIFICATE OF CORRECTION

PATENT NO.    : 6,188,519 B1
DATED         : February 13, 2001
INVENTOR(S)   : Kenneth Carlisle Johnson It is certified that error appears in the above-identified patent and that said Letters Patent is hereby corrected as shown below:

Column 2,
Line 47, change "and" to -- an --.

Column 3,
Lines 54½ and 63, change "$Y_2$" to -- $y_2$ --.

Column 4,
Lines 1, 3, 6 and 7, change "$Y_2$" to -- $y_2$ --.
Line 56, change "214" to -- 214 --.
Line 59, change "1560" to -- 1560 --.
Line 63, change "1434" to -- 1434 --.

Signed and Sealed this

Twenty-second Day of July, 2003

JAMES E. ROGAN
*Director of the United States Patent and Trademark Office*